United States Patent [19]
Yosset

[11] 3,949,277
[45] Apr. 6, 1976

[54] ELECTRIC POWER DISTRIBUTION CABINET COMMANDED BY A PROGRAMMABLE CONTROLLER

[75] Inventor: Paul Yosset, Velizy, France

[73] Assignee: Regie Nationale des Usines Renault, Hauts-de-Seine, France

[22] Filed: July 9, 1974

[21] Appl. No.: 486,812

[30] Foreign Application Priority Data
July 18, 1973 France .............................. 73.26313

[52] U.S. Cl. ........... 317/120; 307/147; 235/151.21; 340/147 R
[51] Int. Cl.² ..................... H02B 1/10; H02B 1/20
[58] Field of Search .............. 174/70 B, 71 B, 72 B; 307/31, 42, 147; 235/151.21; 340/166 R, 147 R, 147 G, 147 CV, 147 CN, 147 P, 147 PC; 317/99, 101 CB, 101 DH, 112, 118, 120, 122

[56] References Cited
UNITED STATES PATENTS

| | | | |
|---|---|---|---|
| 2,885,600 | 5/1959 | Wiseman | 317/122 |
| 3,657,608 | 4/1972 | Leone | 317/118 |
| 3,725,746 | 4/1973 | Carroll | 317/120 |
| 3,769,552 | 10/1973 | Cook | 317/112 |
| 3,786,313 | 1/1974 | Coles | 174/70 B |
| 3,793,564 | 2/1974 | Salvati | 317/120 |

*Primary Examiner*—Gerald P. Tolin
*Attorney, Agent, or Firm*—Oblon, Fisher, Spivak, McClelland & Maier

[57] ABSTRACT

A cabinet for distribution of electric power controlled by a programmable controller comprising a housing for holding frames, said housing having entering therein a multibus which combines the lines carrying addresses and commands sent by the controller and the power supply lines, said housing having leaving therefrom a plurality of distribution lines; said frames functioning to hold modular power elements in side-by-side arrangement, said frames being each provided with a multibus branch connected to the housing multibus input and fitted at the location of each module with a terminal for each command line and two address terminals, said address terminals having a voltage applied to them when the location is selected by the means of selection present in said multibus branch of the frame; supply buses connectable to the housing power input and being provided with plug-holes for connection of the modular elements; said modular elements being connectable to the multibus and buses of a frame at any location of said frame and having memories which store the commands from the controller upon authorization to read given by the address selection of the frame, said modular elements distributing the currents for execution of the controller's commands.

1 Claim, 14 Drawing Figures

ELECTRIC POWER DISTRIBUTION CABINET COMMANDED BY A PROGRAMMABLE CONTROLLER

BACKGROUND OF THE INVENTION

1. Field of the Invention

The invention generally concerns a cabinet for the control of power for electric machines, the cabinet being situated between a programmable controller and the electric machines or actuating devices. It contains the switchgear required for supplying power to the latter or, in exceptional cases, relay control signals, according to the instructions received from the controller.

This invention is more particularly applicable to machining operations, assembling machines and the handling operations between them, as well as the field of automated machine assembly for mass production.

2. Description of the Prior Art

The automatic systems currently used in these fields are sequential types without programmers. Besides the difficulty of initial construction, adding operations or changing the order of operations is rather difficult. The resulting modifications of the wiring and the power controller cabinets are often extensive and costly. It is not surprising that this approach leads to lengthy work stoppages.

Automated systems with programmers have been used but very rarely with machine tools. These systems resulted in cabinets as complex as those of sequential systems with the cabinets requiring numerous cables between the machines and the programmer and between the programmer and the cabinet. Moreover, there was no improvement in out of service time.

SUMMARY OF THE INVENTION

There now exist electronic means of automated control which use the techniques of information theory and are programmable for that reason. These devices, referred to hereafter as programmable controllers or computers, present, among others, the following advantages: (1) they can be bought complete, or can be assembled from a few easily procured components, and put into operation quickly; (2) they are provided with standardized memories; (3) they are capable of generating several hundred instructions per second; (4) they permit the control of different operations and the coordination of them and thus disperse with any need for communication between the power units.

To control a device, the controller sends out an instruction, coded or not, which requires: (1) output signal lines (five to 10 for example); (2) an outer interface (coupling logic circuit) for a binary command, or, in effect, one per output; (3) communicating lines between output interfaces and the lower unit; (4) a power unit which supplies the current necessary for executing the command, either directly to the device controlled or to relays.

One system for controlling $n$ devices consists of repeating $n$ times the procedure necessary for one device. This results in a large number of output lines, output interfaces and communicating lines.

A second system for controlling $n$ devices consists of the use of the known method of addressing. In this method: (1) the command, regardless of the power unit involved, passes along the same output lines, interfaces and communicating lines; (2) all of the power elements are connected in parallel, by gates, to each of the said communicating lines; (3) the address permits specification of the power unit concerned; (4) the transmission of the address from the controller to the power units grouped together in the cabinet requires output lines, an output interface to generate the binary address, communicating lines and means of interpreting the address; (5) the power units should be capable of remembering the order until a new one is received.

The assembly of lines for communicating the command and the address between output interfaces and power units is combined in a multibus called hereafter a cabinet multibus.

The invention is directed to simple electric cabinets capable of utilizing this second system of controlling a large number of devices.

More specifically, the objects of the invention are (1) the standardization of power units so as to make them into modular elements which can be operated and tested outside the cabinets; (2) the standardization of the other components of the cabinets so that they too can be operated and tested outside the cabinets; (3) the capability of very rapid assembly and disassembly of the cabinets. Other objects will appear hereafter.

The invention permits benefits to be derived: (1) from the lower cost of the equipment between the controller and power units resulting from the use of addressing, i.e., the reduction in cost of output lines, output interfaces and multibus in going from the first control system mentioned above to the second system is in the ratio of 10 to 1; (2) from the reduction in cost of the cabinets resulting from the standardization of the components, notably the modular elements; (3) from the elimination of the necessity for fine adjustments in starting up the installation.

Finally, the cost of the electric equipment, controller included, for controlling an installation does not exceed that of the sequential control electrical equipment for the same installation. And, in addition, the user can then benefit from the advantages resulting from the employment of a programmable controller; i.e., there is a reduction of delays in manufacture; unforeseen modifications and additions of functions are made possible without difficulty; great latitude is provided in locating the cabinets in the installation.

A cabinet according to the invention consists of three principal parts: (1) the housing; (2) the frames, or racks, at the level of which address selection is effected; (3) the unifunctional, standardized power unit modules arranged in the frames like books in a library.

To these main components are added accessories such as modular service elements, cabinet access door, covers, etc.

The housing is similar to that of existing cabinets. It may have any form desired. Elements entering the cabinet are: (1) the cabinet multibus described above; (2) the supply circuits, i.e., power buses, simple current connections, etc.; (3) the output lines, i.e., direct power outputs or control circuits for electric relays or electrovalves.

The frames which hold the modular power units are fastened to the housing and comprise (1) a multibus connected to the cabinet multibus with one contact per command line and two address contacts at the receptacle of each module, the selection of the address being effected on the frame multibus at the receptacle of each module; (2) supply buses connected to the housing supply and having holes at each module receptacle for power connection; (3) means for guiding and fastening the modules.

The modules which are themselves removable are attached to the frames. They have at their ends in the rear of the frame: (1) plugs for the address and commands connected with the frame multibus; (2) pins for connecting to the frame supply buses with output terminals on their front face.

The maintenance elements provide, in case of need, functions such as D. C. Voltage supply, voltages and currents of special types, recording etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
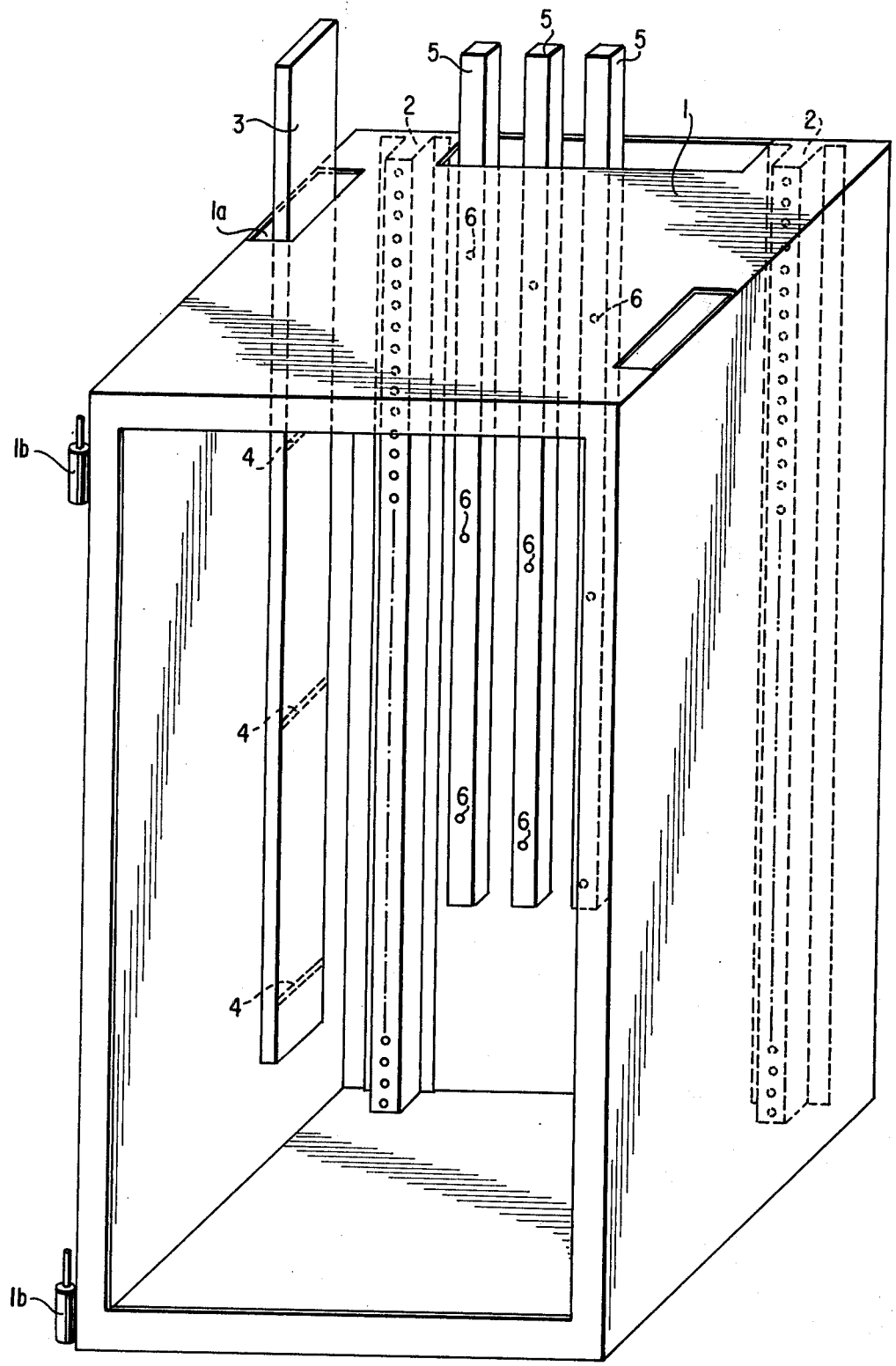
FIG. 1 is a view in perspective of a cabinet housing with its multibus and supply buses.

Referring to FIG. 1 it is seen that the housing is a rectangular parallelepiped of mono-block, sheet metal construction 1 open at the front and with utility openings such as 1a cut in its upper and lower ends. This housing contains: the rails 2 for attaching the frames; the multibus 3 provided with connector sockets 4 at the level of each frame; the power buses 5 each with a tapped hole 6 at the level of each frame; the pins 1b for hinging the door.

Figure 2:
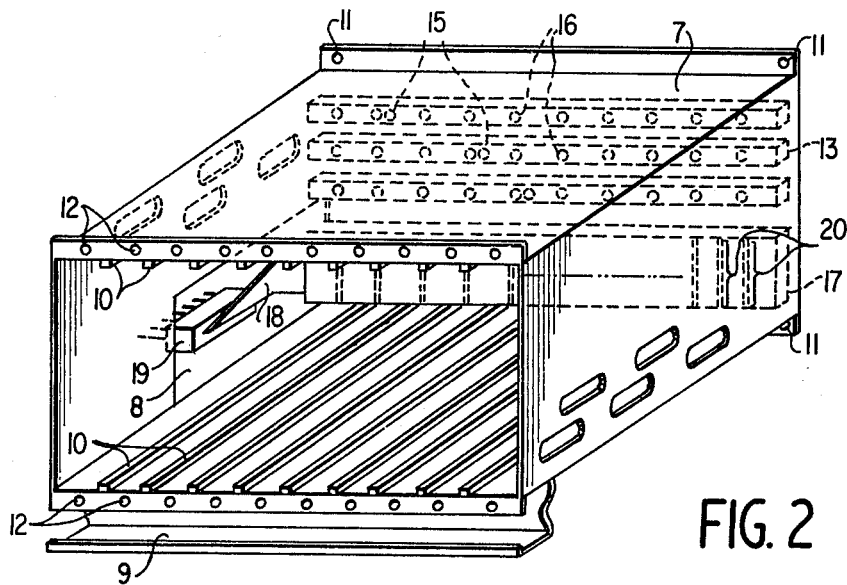
FIG. 2 is a front view of a frame.
Figure 3:
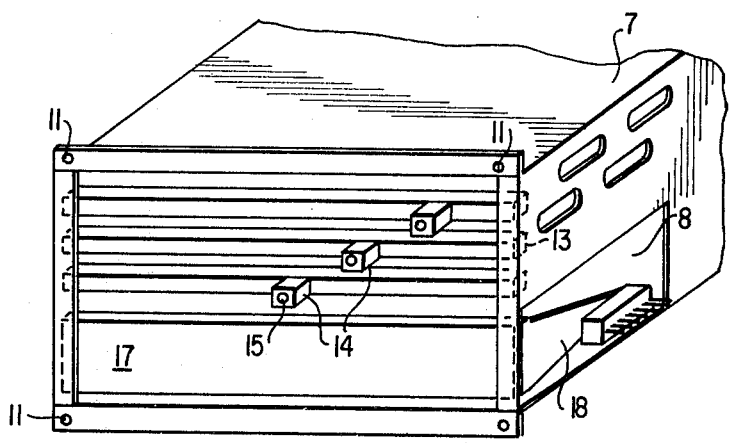
FIG. 3 is a rear view of a frame.

A frame 7 for 10 power unit modules is shown from the front in FIG. 2 and from the rear in FIG. 3. This frame is in the form of a parallelepiped with open front and rear. The sides and top and bottom with perforations are of sheet metal, steel or aluminum, or of plastic. The front and back edges of the top and bottom are bent outwards to stiffen them and permit fastening the frame and the modules. The back edges of the sides are bent inwards to permit fastening the multibus and the supply buses. Openings such as 8 can be provided to facilitate assembly. Details of the structure include at the lower front, the channel 9 through which the output lines run; the strips 10 for guiding the modules, some of the strips being joinable vertically to increase the rigidity of the frame; the holes 11 through which pass the screws for fastening the frame to the rails 2 of the housing; the supply buses 13 provided with projections 14 for support against the housing buses and having holes 15 for the screws for fastening to the buses 5 and having holes 16 for plugging the modules into the buses; the multibus 7 containing the assembly of address and command lines, it being extended by a flexible piece 18 terminating in the connector 19 which plugs into the housing multibus 3; the multibus 17 containing arrays of plug holes 20 at the location of each module.

Figure 4:
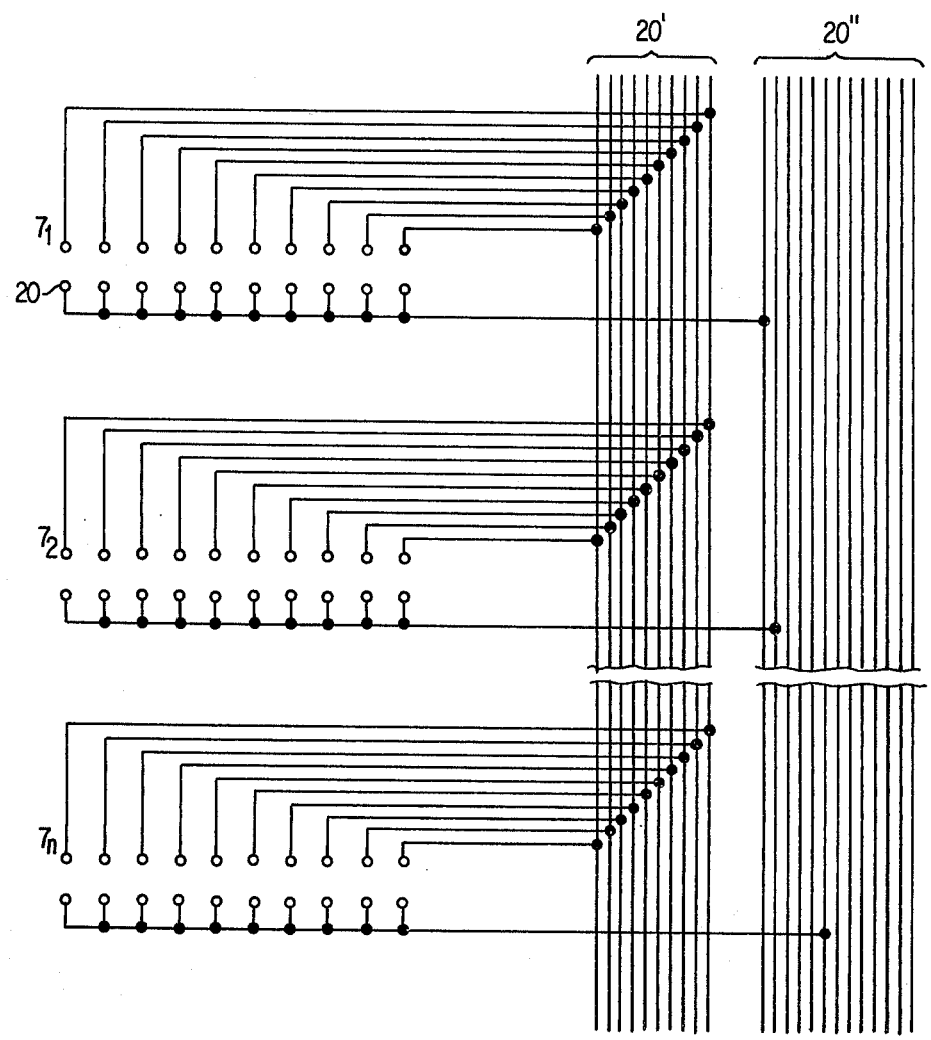
FIG. 4 is a schematic of the wiring of the frames to the address lines of the multibus showing address selection in a first example.
Figure 13:
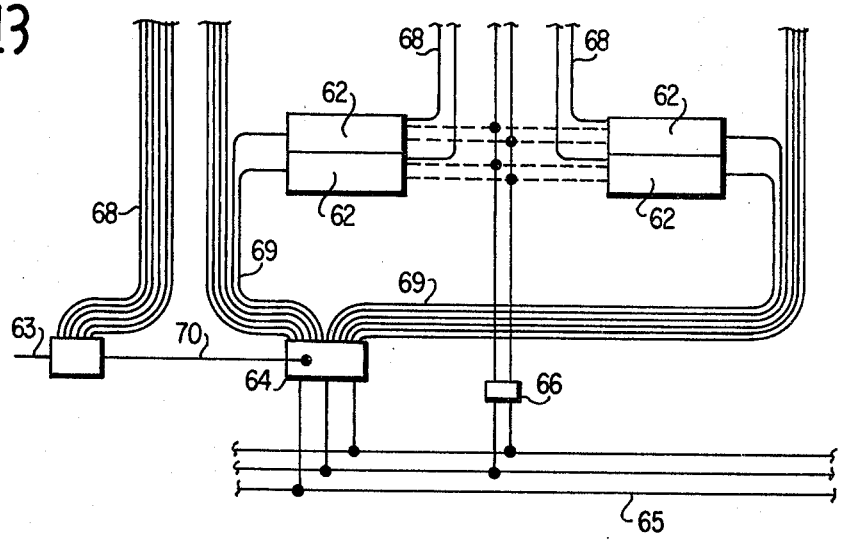
FIGS. 13 and 14 are slight variations of the schematic of FIG. 12.

At each of these locations, two of these plug holes 20 serve for address selection of that location and the others are each connected to a command line. Upon selection of a modular element, this causes, at the level of the element, the opening of a gate which permits reception of the command transmitted by the multibus and initiates its storage in the memory. This selection is realized by applying voltage only to the two address terminals of the location concerned. Two means of doing this will be described below:

The first means consists of having at the controller output as many lines 20' of one polarity as there are modules in a frame and as many lines 20'' of another polarity as there are frames. The excitation of line $i$ of the first polarity on the one hand and the excitation of line $j$ of the second polarity on the other hand permits selection of module $i$ of frame $j$. FIG. 4 shows a schematic of the wiring. The frame multibus has only eleven lines in this example: 10 of the modular element polarity and one of the frame polarity. The mutlibuses are the same from one frame to another, only the connector 19 plugging into the housing multibus differs with respect to the pin of frame polarity. This difference permits avoidance of an error in placement of the frames.

Figure 5:
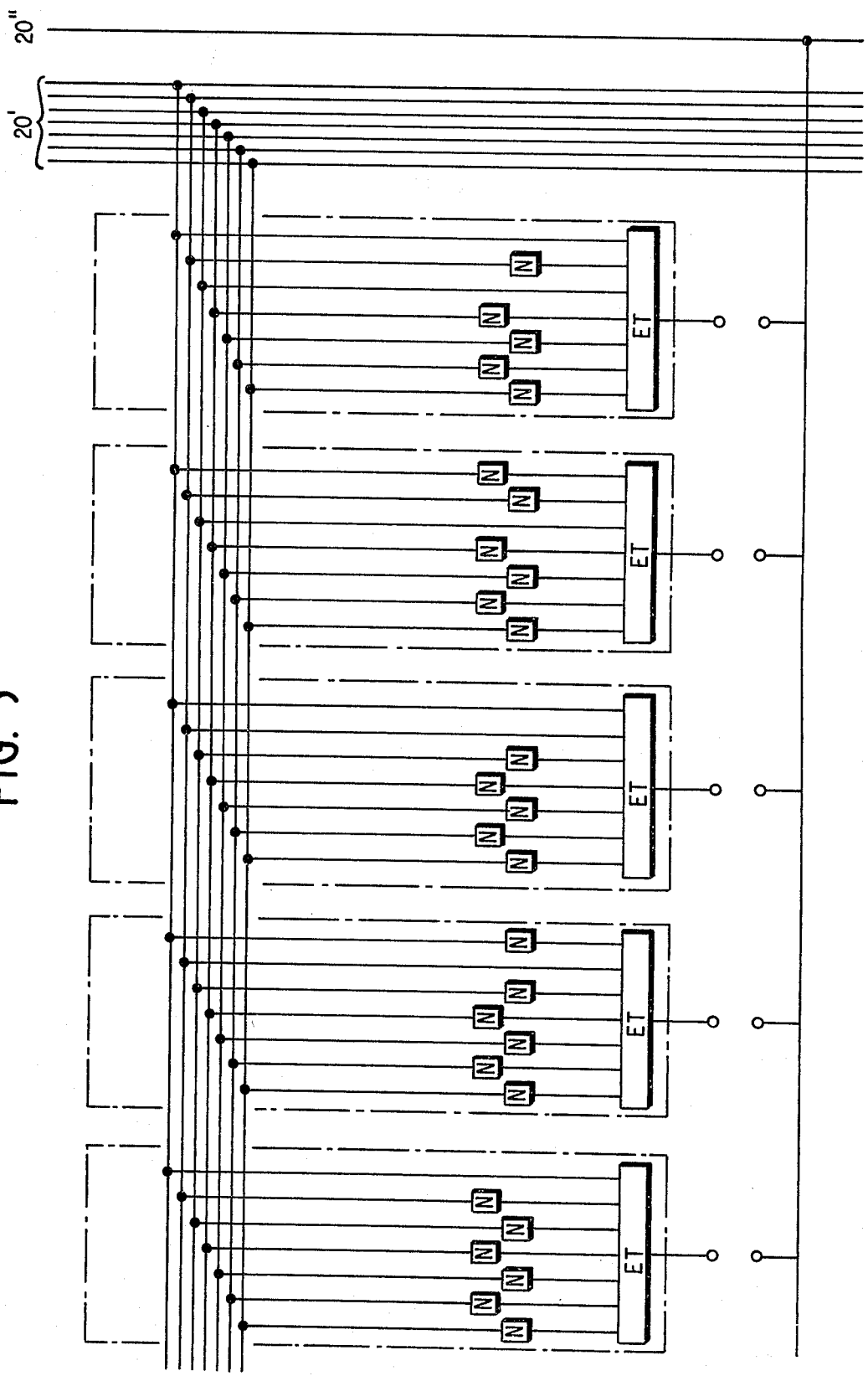
FIG. 5 is a schematic of the wiring of the frames to the address lines of the multibus with address decoders in a second example.

The second method consists of transmitting a coded address. FIG. 5 shows, in the case of a pure binary code, a selection logic made up of AND and NOT circuits, the through-connected lines corresponding to a 1 and those having a "NOT" circuit corresponding to a 0. The circuits and components required at each module location may be on a printed circuit card. The different cards are plugged into the frame multibus, each facing the corresponding element. Technologies other than printed circuit cards may obviously be utilized.

Selection by means of printed circuit cards is also usable with codes other than pure binary. In practice the selection card could be put in a molded block of any form.

Many other systems of address transmission and selection could just as well be used. In every case, this selection must always be realized at the level of the frame multibuses, and, at every module location, the arrangement of the connections must be strictly the same. They will be designated hereafter by the term address decoder.

Figure 6:
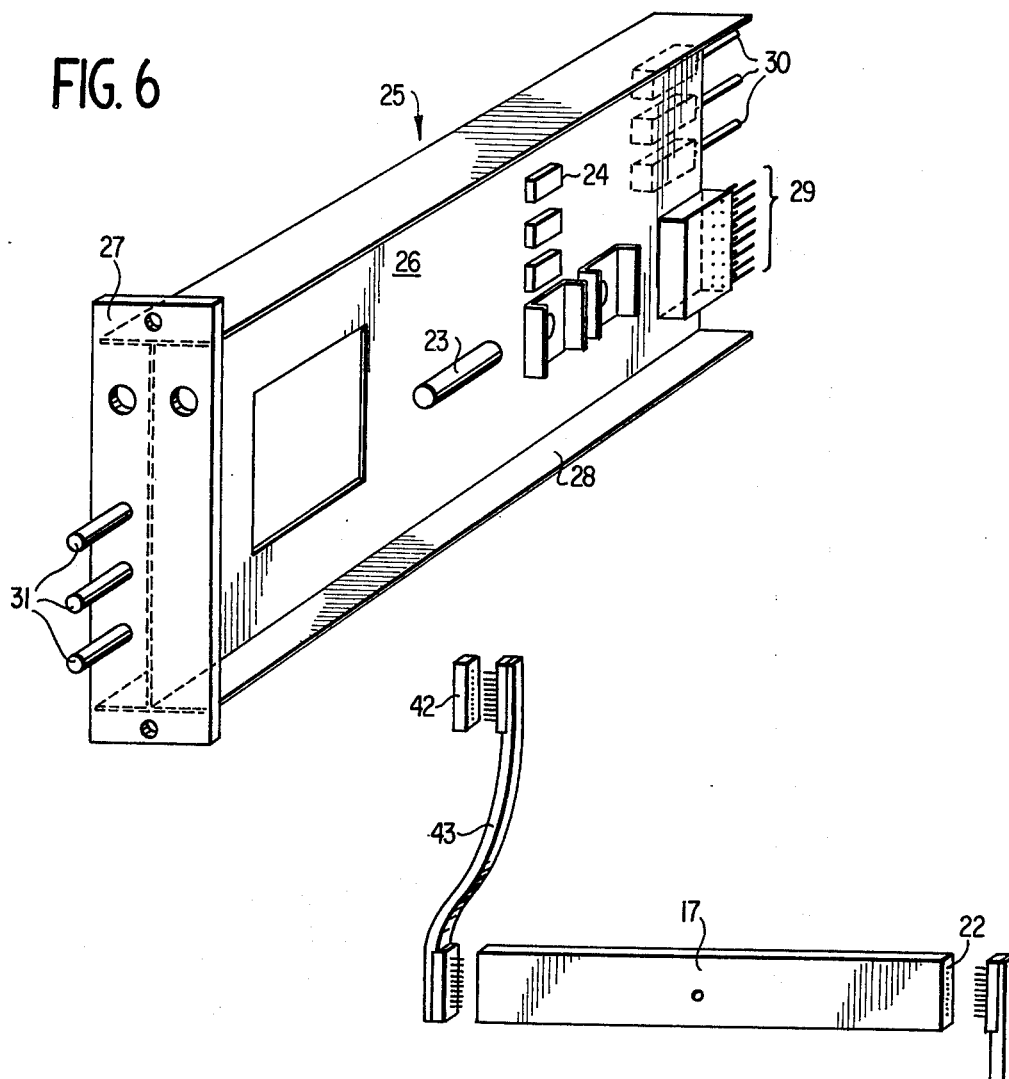
FIG. 6 is a perspective view of a module.

Each modular element 25 (FIG. 6) consists of a support made up essentially of an insulating, rigid sheet 26 fastened at one end to a front panel 27 of metal or plastic. These sheets 26 and 27 are held firm by two stiffeners 28. The insulating sheet or card 26 holds: (1) the components 24 common to all the modules, i.e., the gates for reception of controller commands and the memory for registering the commands; (2) the multibus connector 29 (plugging into the sockets 20), the power plugs 30 mating with the frame buses, and, across the front panel 27, the output terminals 31; (3) the components 23 for executing the commands of the controller.

The modular elements shown may be mounted at any position in the frames and perform the following functions: breaking or making a circuit; furnishing current for rotation in one direction or the other; furnishing current for fast or slow rotation in each direction.

In practice the number of these functions is very limited. It is thus possible to design these elements with all the care desired, and then make them in quantity in advance based on anticipated uses.

Figure 7:
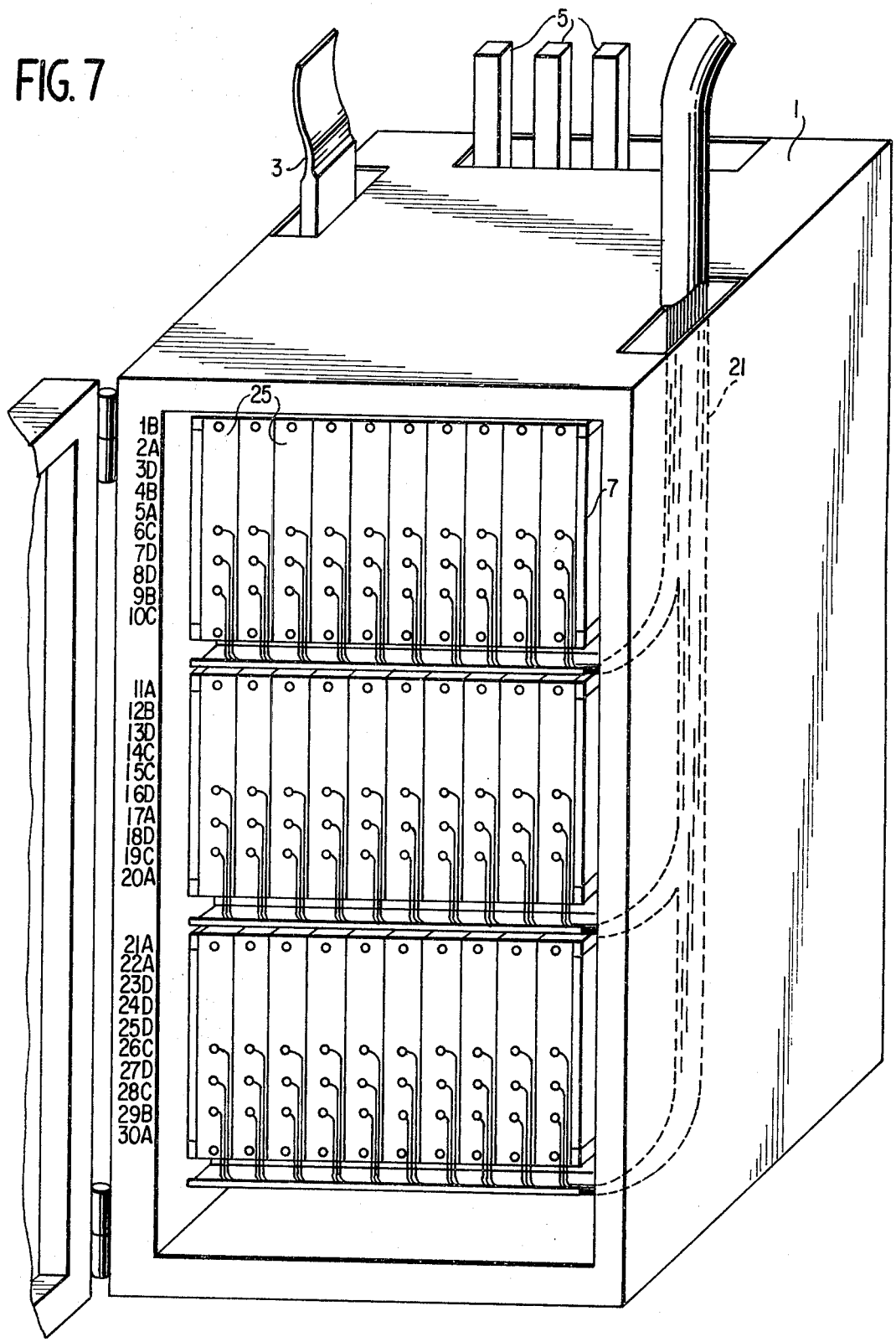
FIG. 7 is a perspective view of a cabinet fitted with its frames.

The frames with power elements 25 therein as disposed in the cabinet are illustrated in FIG. 7. The different locations of the modules 25 are numbered from 1 to 30 counting from left to right and from top to bottom. The different types of modules are indicated by the letters A, B, C, D, the element to be placed in each location being noted on the left side of the front of the housing. To avoid any confusion in mounting, the output lines 21 of each element 25 (connected to the output terminal 31 of the elements) may be numbered.

In the example described, there is adopted a vertical arrangement of the supply buses in the housing and tapping from the cabinet multibus.

Figure 9:
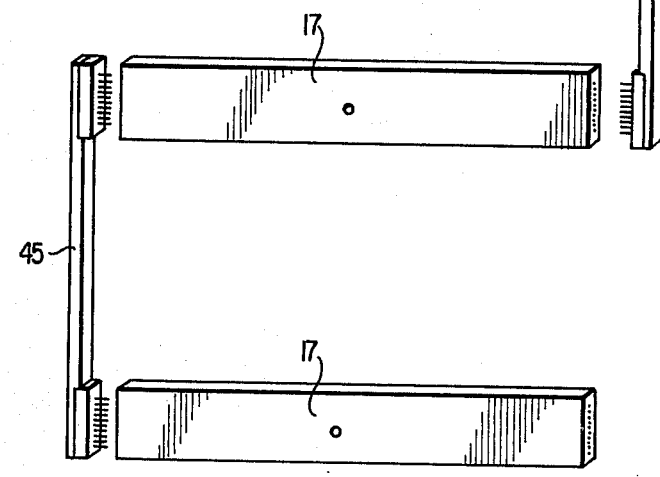
FIG. 9 is a perspective view showing the connection of the frames to the cabinet multibus connector.
Figure 8:
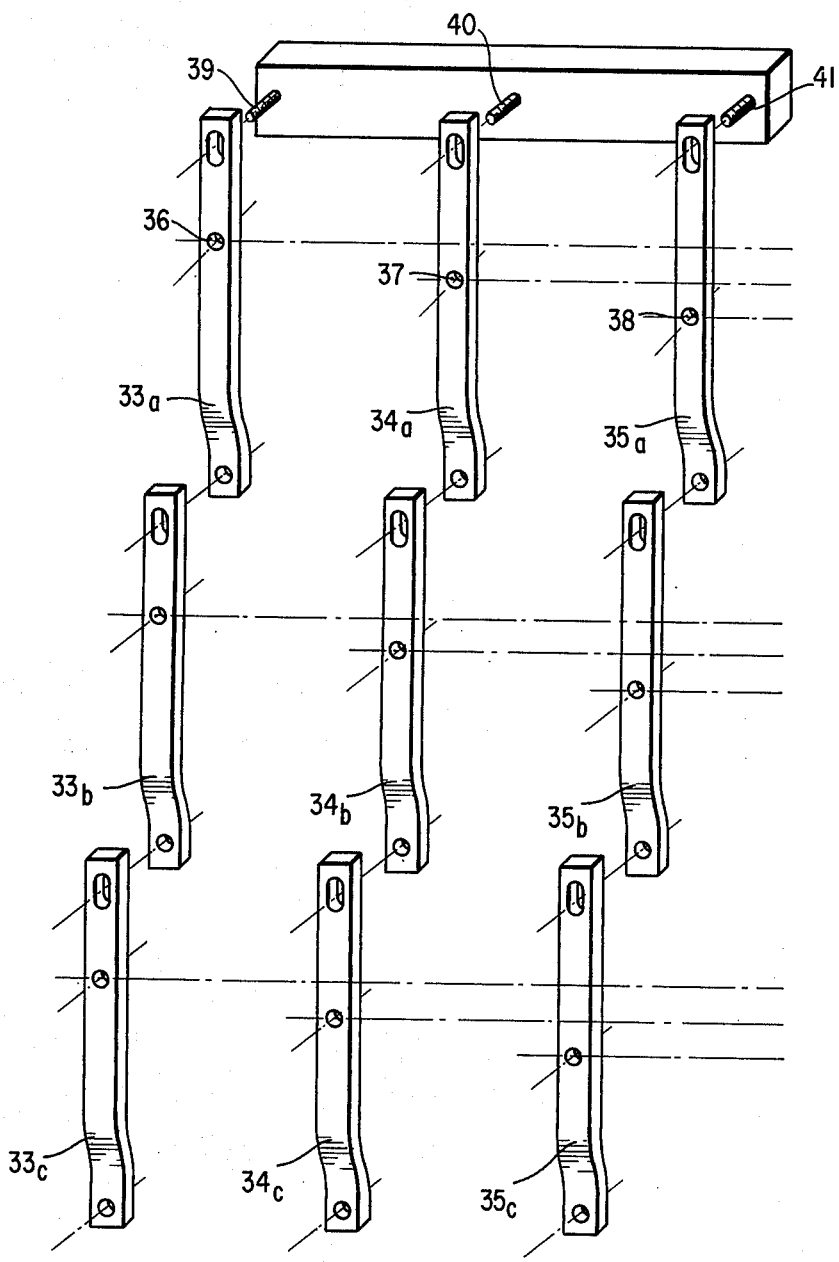
FIG. 8 is a perspective view showing the connection of the frames to the power terminals of a cabinet.
Figure 10:
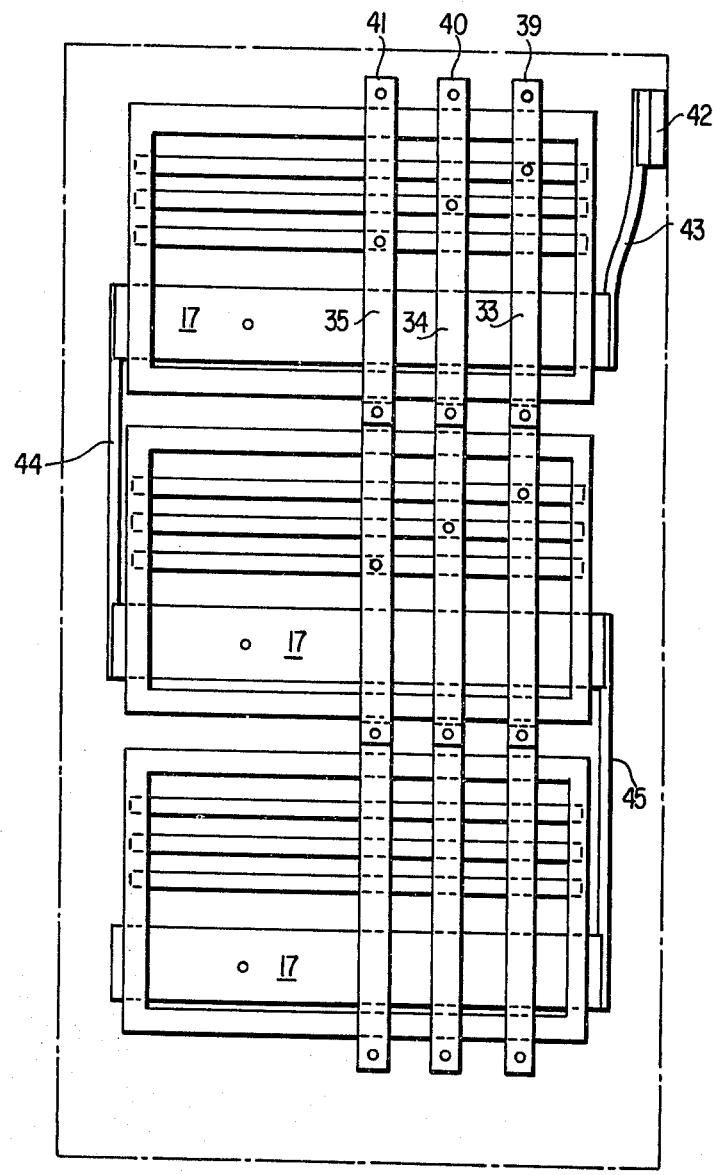
FIG. 10 is a rear view of the frames connected to the cabinet as shown in FIGS. 8 and 9.

However, it is possible to use a cabinet in which power terminals and a multibus connector are on the housing. FIGS. 8 and 9 and 10 show how the connections could be made in this case.

The top frame has buses 33a, 34a and 35a connected by screws at 36, 37 and 38 to the horizontal buses 13 of the frame by means of the holes 15. The next lower frame has identical buses 33b, 34b and 35b fastened in the same way to its horizontal buses, and so on.

As shown in FIG. 8, the buses 33a, 34a and 35a of the top frame are connected to terminals 39, 40 and 41 of the housing. The different buses 33 of different frames are connected together. The same holds true with respect to bars 34 and 35.

FIG. 9 shows that the multibuses 17 of the frames have plug hole connections 22 to the different lines at their two ends. The multibus of the top frame is connected to the housing receptacle 42 by the bundle of conductors 43 with connectors at its two ends. The different multibuses are connected in series by the bundles of conductors 44, 45 . . . each with two connector plugs.

FIG. 10 shows the rear of the frames for an application of the connections illustrated by FIGS. 8 and 9.

A cabinet with three frames of ten modular elements, each with a supply of power on three lines has been previously described. It is evident that the number of frames as well as the number of modular elements in a frame is arbitrary. Similarly, any number of supply lines may be used, each feeding one or another of the frames or the assembly of frames. In particular, some devices, of the installation to be controlled or of the modular elements themselves, may require special power, voltage, etc, and it is useful, obviously, to bring in such power to the frames concerned. This power would also be produced with a service element of the frame which would apply voltage to buses to which the modules would be connected. Also, the possiblity should not be excluded of producing such power in a special frame of the cabinet.

Finally, it is obvious that the various entrances and exits for the lines described as being at the top of the cabinet could be located on any of the cabinet surfaces.

Figure 11:
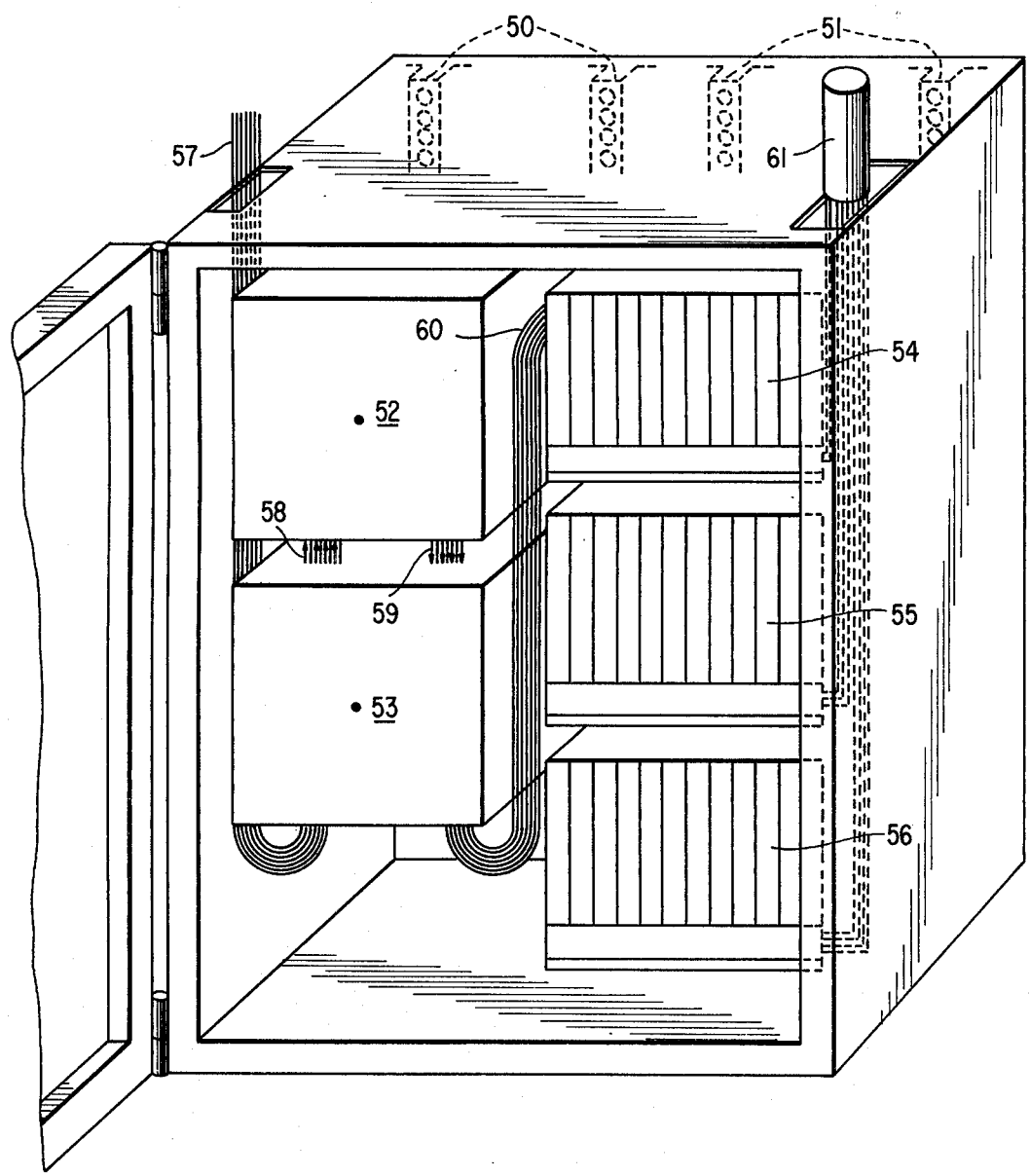
FIG. 11 is a view of a variant of the cabinet.

It is also possible to combine controller, circuits, interfaces (input and output) and power elements in the same cabinet. To this end, as shown in FIG. 11, the controller 52 and the interfaces 53, interconnected by lines 58 and 59, are fastened to the rails 50. The frames 54, 55 and 56 are fastened to the rails 51. The lines 57 transmit the information emanating from the control panel and units. The multibuses 60 tie the interfaces to the frames. The output lines 61 feed the units to be controlled.

The reduced number of lines in the cabinet multibus permits, at the price of proper protection against parasitics, separation of the controller and cabinet interfaces. Since, in addition, the feedback lines between the controlled devices and controller are small in cross section, the controller can be located wherever desired and can easily be moved.

Figure 12:
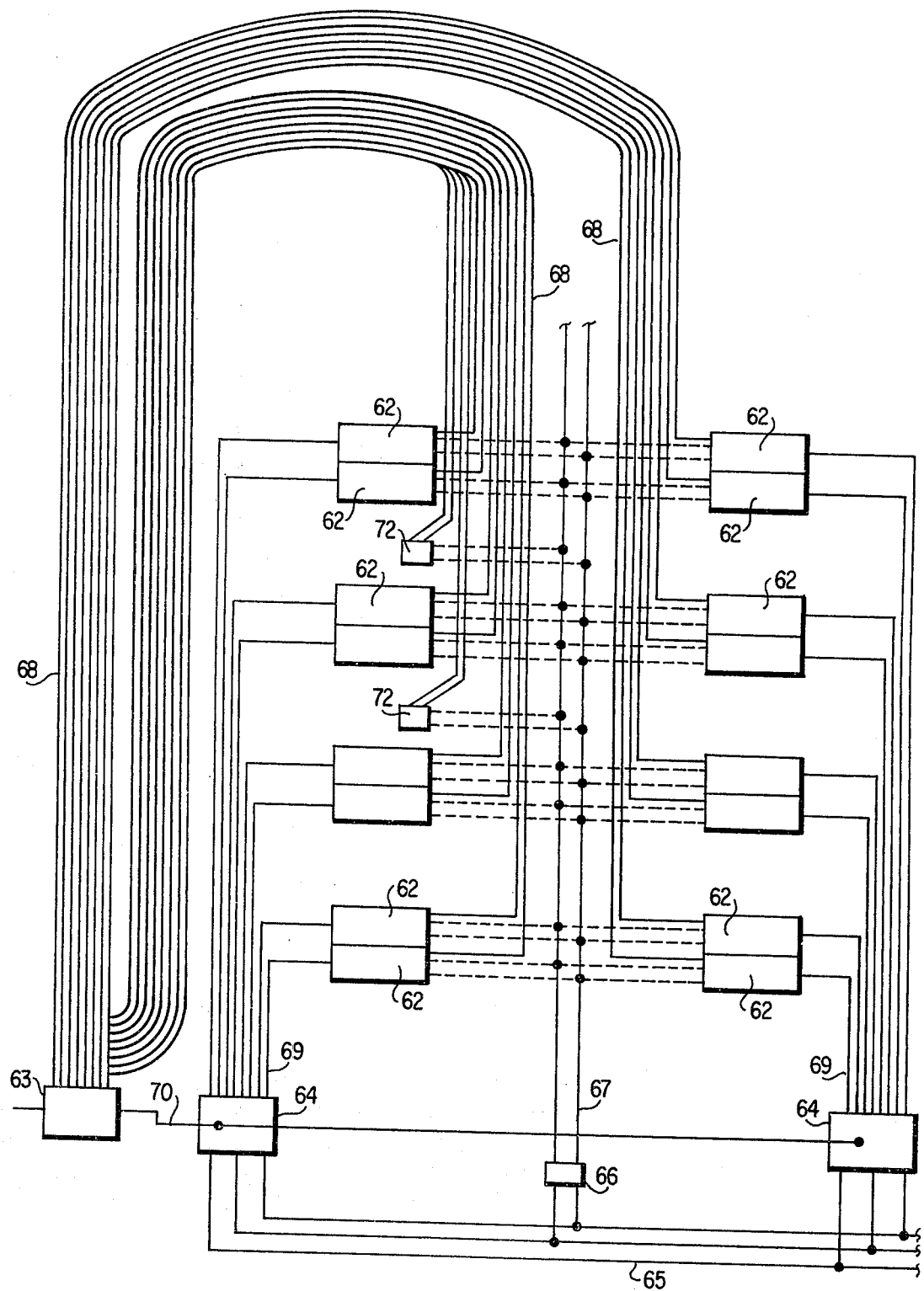
FIG. 12 is a general schematic of a machine tool controller installation.

FIG. 12 shows schematically the general wiring of an installation. A battery of controlled units 62 such as machine tools are arranged in two rows and are fed power obtained from power lines 65 by way of lines 69 according to the sequences determined by the elements of the cabinets 64 which are under the control of instructions furnished by a programmable controller 63 by means of the multibus 70. The controller 63 receives information about the positions of units 62 by means of the information input circuits 68 between each unit 62 and the controller. The assembly of these circuits 68 is powered by the lines 67 coming from a group 66 obtaining current from power lines 65.

Figure 14:
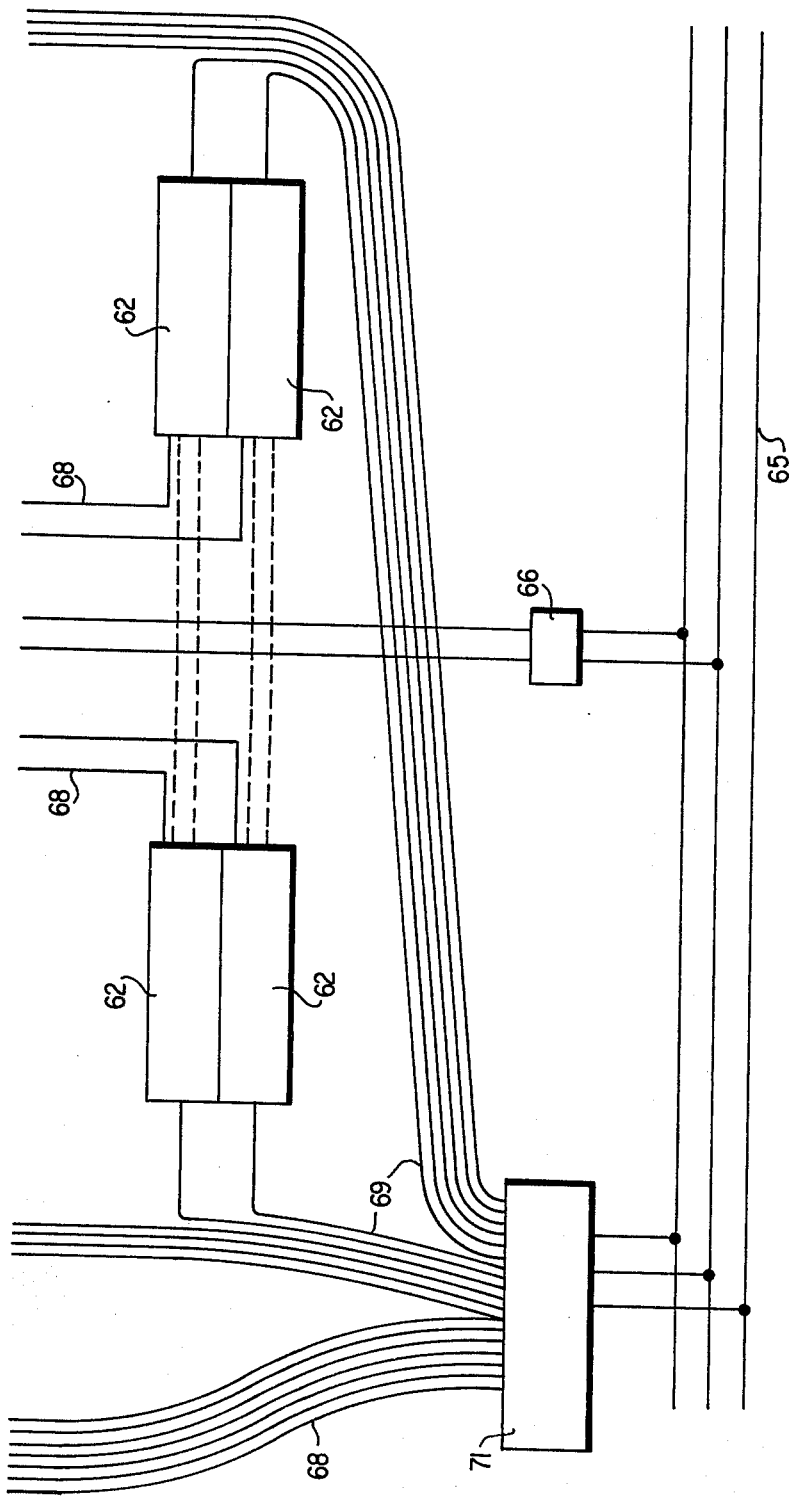

In the variation in FIG. 14, the controller 63 is incorporated in the power cabinet 71 as was described with respect to FIG. 11.

In addition to the considerable reduction in cost of output interfaces, the multibus and the cabinets resulting from the standardization of the modular elements and the components of the frames and housings, the invention permits reduction of the delays in production by the machines.

Although conceived more especially for employment with machining or machine assembly operations, the invention may be advantageously used whenever one words with a controller or a director of control associated with power controls.

Obviously numerous modifications and variations of the present invention are possible in light of the above teachings. It is therefore to be understood that within the scope of the appended claims, the invention may be practiced otherwise then as specifically described herein.

What is claimed as new and desired to be secured by Letters Patent of the United States is:

1. Apparatus for providing an interface between a programmable controller and a plurality of units controlled by the programmable controller comprising:
   a housing,
   a plurality of frames rigidly attached to the housing,
   a plurality of modular elements slidably disposed within the plurality of frames,
   each modular element comprising:
      first, second and third vertically disposed power plugs disposed at one end of the modular element, a vertically disposed modular element multibus connector disposed at one end of the modular element, a plurality of output terminals disposed at another end of the modular element, each frame comprising:

first, second and third horizontally disposed frame supply buses, the first frame supply bus being aligned with and connected to the first power plug of each modular element within the frame, the second frame supply bus being aligned with and connected to the second power plug of each modular element within the frame, the third frame supply bus being aligned with and connected to the third power plug of each modular element with the frame, a frame multibus connector horizontally disposed adjacent to the first, second and third frame buses and being so positioned that it is aligned with and is connected to each modular element multibus connector disposed in the frame, a frame connector connected to the frame multibus connector, the housing comprising:

a vertically disposed housing multibus aligned with and connected to each frame connector thereby providing a connection to each frame multibus connector, first, second and third vertically disposed housing power buses, the first housing power bus being aligned with and connected to each first frame supply bus, the second housing power bus being aligned with and connected to each second frame supply bus, the third housing power bus being aligned with and connected to each third frame supply bus, the housing multibus being connected to the programmable controller, the plurality of output terminals of the modular elements being connected to the plurality of units controlled by the programmable controller.

* * * * *